United States Patent [19]

Kattemalalavadi et al.

[11] Patent Number: 5,243,342
[45] Date of Patent: Sep. 7, 1993

[54] INTEGRATED PCM LEVEL CONTROL AND CONVERSION USING A LOOKUP TABLE

[75] Inventors: Shrikanth S. Kattemalalavadi, San Jose; Charles S. T. Williams, Palo Alto, both of Calif.

[73] Assignee: Stratacom, Inc., San Jose, Calif.

[21] Appl. No.: 918,931

[22] Filed: Jul. 22, 1992

Related U.S. Application Data

[63] Continuation of Ser. No. 589,677, Sep. 28, 1990, abandoned.

[51] Int. Cl.$^5$ .............................................. H03M 7/42
[52] U.S. Cl. ...................................... 341/106; 375/25
[58] Field of Search ..................... 341/106, 51, 76, 52, 341/53, 55, 64, 75; 375/25, 26, 23, 22; 370/58.1

[56] References Cited

U.S. PATENT DOCUMENTS

| | | | |
|---|---|---|---|
| 4,206,447 | 6/1980 | Ching et al. ........................ | 341/51 |
| 4,491,945 | 1/1985 | Turner . | |
| 4,494,230 | 1/1985 | Turner . | |
| 4,501,001 | 2/1985 | Virupaksha et al. ................. | 375/30 |
| 4,506,358 | 3/1985 | Montgomery . | |
| 4,661,946 | 4/1987 | Takahashi et al. ................. | 370/58.1 |
| 4,771,425 | 9/1988 | Baran et al. . | |
| 4,819,228 | 4/1989 | Baran et al. . | |
| 4,903,261 | 2/1990 | Baran et al. . | |

OTHER PUBLICATIONS

Pagnucco & Erskine, "Companding Routines for the TMS2010/TMS2020", *Digital Signal Applications With the TMS 320 Family—Theory, Algorithms and Implementations* by Texas Instruments, Inc., pp. 169-197 (1986).

*General Aspects of Digital Transmission Systems; Terminal Equipments—Recommendations G.700-G.795*, vol. 3—Fascicle III.4 by CCITT (the International Telegraph and Telephone Consultive Committee), International Telecommunication Union pp. 76-96 and 175-184 (Nov. 1988).

D. Sparrell & M. Sherif, *Contribution to Working Parity T1Y1.2 on Specialized Voice and Data Processing, Information on CCITT Work on Packetzed Speech*, AT&T, No. T1Y1.2/88-047, pp. 1-83 (Jul. 28, 1988).

*Primary Examiner*—A. D. Pellinen
*Assistant Examiner*—Brian K. Young
*Attorney, Agent, or Firm*—Blakely, Sokoloff, Taylor & Zafman

[57] ABSTRACT

A method and apparatus for converting a signal by reading a first signal that is represented in a first format. The first signal is used as an index into a lookup table, the first table containing entries representing signals in a second format modified by a gain. The first table outputs a second signal responsive to the index provided by the first signal, wherein the second signal is represented in a second format.

10 Claims, 7 Drawing Sheets

FIG. 2

FIG_3

FIG_4 INITIALIZING CONFIGURATION RAM

FIG. 6A μ-255 BINARY ENCODING TABLE

| BIASED INPUT VALUES | | | | | | | | | | | | | COMPRESSED CODE WORD | | | | | | |
|---|---|---|---|---|---|---|---|---|---|---|---|---|---|---|---|---|---|---|---|
| BITS: 12 | 11 | 10 | 9 | 8 | 7 | 6 | 5 | 4 | 3 | 2 | 1 | 0 | BIT: 6 | 5 | 4 | 3 | 2 | 1 | 0 |
| 0 | 0 | 0 | 0 | 0 | 0 | 0 | 1 | $Q_3$ | $Q_2$ | $Q_1$ | $Q_0$ | x | 0 | 0 | 0 | $Q_3$ | $Q_2$ | $Q_1$ | $Q_0$ |
| 0 | 0 | 0 | 0 | 0 | 0 | 1 | $Q_3$ | $Q_2$ | $Q_1$ | $Q_0$ | x | x | 0 | 0 | 1 | $Q_3$ | $Q_2$ | $Q_1$ | $Q_0$ |
| 0 | 0 | 0 | 0 | 0 | 1 | $Q_3$ | $Q_2$ | $Q_1$ | $Q_0$ | x | x | x | 0 | 1 | 0 | $Q_3$ | $Q_2$ | $Q_1$ | $Q_0$ |
| 0 | 0 | 0 | 0 | 1 | $Q_3$ | $Q_2$ | $Q_1$ | $Q_0$ | x | x | x | x | 0 | 1 | 1 | $Q_3$ | $Q_2$ | $Q_1$ | $Q_0$ |
| 0 | 0 | 0 | 1 | $Q_3$ | $Q_2$ | $Q_1$ | $Q_0$ | x | x | x | x | x | 1 | 0 | 0 | $Q_3$ | $Q_2$ | $Q_1$ | $Q_0$ |
| 0 | 0 | 1 | $Q_3$ | $Q_2$ | $Q_1$ | $Q_0$ | x | x | x | x | x | x | 1 | 0 | 1 | $Q_3$ | $Q_2$ | $Q_1$ | $Q_0$ |
| 0 | 1 | $Q_3$ | $Q_2$ | $Q_1$ | $Q_0$ | x | x | x | x | x | x | x | 1 | 1 | 0 | $Q_3$ | $Q_2$ | $Q_1$ | $Q_0$ |
| 1 | $Q_3$ | $Q_2$ | $Q_1$ | $Q_0$ | x | x | x | x | x | x | x | x | 1 | 1 | 1 | $Q_3$ | $Q_2$ | $Q_1$ | $Q_0$ |

FIG. 6B μ-255 BINARY DECODING TABLE

| COMPRESSED CODE WORD | | | | | | | BIASED OUTPUT VALUES | | | | | | | | | | | | |
|---|---|---|---|---|---|---|---|---|---|---|---|---|---|---|---|---|---|---|---|
| BIT: 6 | 5 | 4 | 3 | 2 | 1 | 0 | BITS: 12 | 11 | 10 | 9 | 8 | 7 | 6 | 5 | 4 | 3 | 2 | 1 | 0 |
| 0 | 0 | 0 | $Q_3$ | $Q_2$ | $Q_1$ | $Q_0$ | 0 | 0 | 0 | 0 | 0 | 0 | 0 | 1 | $Q_3$ | $Q_2$ | $Q_1$ | $Q_0$ | 1 |
| 0 | 0 | 1 | $Q_3$ | $Q_2$ | $Q_1$ | $Q_0$ | 0 | 0 | 0 | 0 | 0 | 0 | 1 | $Q_3$ | $Q_2$ | $Q_1$ | $Q_0$ | 1 | 0 |
| 0 | 1 | 0 | $Q_3$ | $Q_2$ | $Q_1$ | $Q_0$ | 0 | 0 | 0 | 0 | 0 | 1 | $Q_3$ | $Q_2$ | $Q_1$ | $Q_0$ | 1 | 0 | 0 |
| 0 | 1 | 1 | $Q_3$ | $Q_2$ | $Q_1$ | $Q_0$ | 0 | 0 | 0 | 0 | 1 | $Q_3$ | $Q_2$ | $Q_1$ | $Q_0$ | 1 | 0 | 0 | 0 |
| 1 | 0 | 0 | $Q_3$ | $Q_2$ | $Q_1$ | $Q_0$ | 0 | 0 | 0 | 1 | $Q_3$ | $Q_2$ | $Q_1$ | $Q_0$ | 1 | 0 | 0 | 0 | 0 |
| 1 | 0 | 1 | $Q_3$ | $Q_2$ | $Q_1$ | $Q_0$ | 0 | 0 | 1 | $Q_3$ | $Q_2$ | $Q_1$ | $Q_0$ | 1 | 0 | 0 | 0 | 0 | 0 |
| 1 | 1 | 0 | $Q_3$ | $Q_2$ | $Q_1$ | $Q_0$ | 0 | 1 | $Q_3$ | $Q_2$ | $Q_1$ | $Q_0$ | 1 | 0 | 0 | 0 | 0 | 0 | 0 |
| 1 | 1 | 1 | $Q_3$ | $Q_2$ | $Q_1$ | $Q_0$ | 1 | $Q_3$ | $Q_2$ | $Q_1$ | $Q_0$ | 1 | 0 | 0 | 0 | 0 | 0 | 0 | 0 |

FIG. — 7A A-LAW BINARY ENCODING TABLE

| | INPUT VALUES | | | | | | | | | | | | COMPRESSED CODE WORD | | | | | | |
|---|---|---|---|---|---|---|---|---|---|---|---|---|---|---|---|---|---|---|---|
| BITS: | 11 | 10 | 9 | 8 | 7 | 6 | 5 | 4 | 3 | 2 | 1 | 0 | BIT: 6 | 5 | 4 | 3 | 2 | 1 | 0 |
| | 0 | 0 | 0 | 0 | 0 | 0 | 0 | 0 | $q_3$ | $q_2$ | $q_1$ | $q_0$ | 0 | 0 | 0 | $q_3$ | $q_2$ | $q_1$ | $q_0$ |
| | 0 | 0 | 0 | 0 | 0 | 0 | 0 | 1 | $q_3$ | $q_2$ | $q_1$ | $q_0$ | 0 | 0 | 1 | $q_3$ | $q_2$ | $q_1$ | $q_0$ |
| | 0 | 0 | 0 | 0 | 0 | 0 | 1 | $q_3$ | $q_2$ | $q_1$ | $q_0$ | x | 0 | 1 | 0 | $q_3$ | $q_2$ | $q_1$ | $q_0$ |
| | 0 | 0 | 0 | 0 | 0 | 1 | $q_3$ | $q_2$ | $q_1$ | $q_0$ | x | x | 0 | 1 | 1 | $q_3$ | $q_2$ | $q_1$ | $q_0$ |
| | 0 | 0 | 0 | 0 | 1 | $q_3$ | $q_2$ | $q_1$ | $q_0$ | x | x | x | 1 | 0 | 0 | $q_3$ | $q_2$ | $q_1$ | $q_0$ |
| | 0 | 0 | 0 | 1 | $q_3$ | $q_2$ | $q_1$ | $q_0$ | x | x | x | x | 1 | 0 | 1 | $q_3$ | $q_2$ | $q_1$ | $q_0$ |
| | 0 | 0 | 1 | $q_3$ | $q_2$ | $q_1$ | $q_0$ | x | x | x | x | x | 1 | 1 | 0 | $q_3$ | $q_2$ | $q_1$ | $q_0$ |
| | 0 | 1 | $q_3$ | $q_2$ | $q_1$ | $q_0$ | x | x | x | x | x | x | 1 | 1 | 1 | $q_3$ | $q_2$ | $q_1$ | $q_0$ |

FIG. — 7B A-LAW BINARY DECODING TABLE

| | COMPRESSED CODE WORD | | | | | | | | OUTPUT VALUES | | | | | | | | | | | |
|---|---|---|---|---|---|---|---|---|---|---|---|---|---|---|---|---|---|---|---|---|
| BIT: | 6 | 5 | 4 | 3 | 2 | 1 | 0 | BITS: | 11 | 10 | 9 | 8 | 7 | 6 | 5 | 4 | 3 | 2 | 1 | 0 |
| | 0 | 0 | 0 | $q_3$ | $q_2$ | $q_1$ | $q_0$ | | 0 | 0 | 0 | 0 | 0 | 0 | 0 | 0 | $q_3$ | $q_2$ | $q_1$ | $q_0$ |
| | 0 | 0 | 1 | $q_3$ | $q_2$ | $q_1$ | $q_0$ | | 0 | 0 | 0 | 0 | 0 | 0 | 0 | 1 | $q_3$ | $q_2$ | $q_1$ | $q_0$ |
| | 0 | 1 | 0 | $q_3$ | $q_2$ | $q_1$ | $q_0$ | | 0 | 0 | 0 | 0 | 0 | 0 | 1 | $q_3$ | $q_2$ | $q_1$ | $q_0$ | 1 |
| | 0 | 1 | 1 | $q_3$ | $q_2$ | $q_1$ | $q_0$ | | 0 | 0 | 0 | 0 | 0 | 1 | $q_3$ | $q_2$ | $q_1$ | $q_0$ | 1 | 0 |
| | 1 | 0 | 0 | $q_3$ | $q_2$ | $q_1$ | $q_0$ | | 0 | 0 | 0 | 0 | 1 | $q_3$ | $q_2$ | $q_1$ | $q_0$ | 1 | 0 | 0 |
| | 1 | 0 | 1 | $q_3$ | $q_2$ | $q_1$ | $q_0$ | | 0 | 0 | 0 | 1 | $q_3$ | $q_2$ | $q_1$ | $q_0$ | 1 | 0 | 0 | 0 |
| | 1 | 1 | 0 | $q_3$ | $q_2$ | $q_1$ | $q_0$ | | 0 | 0 | 1 | $q_3$ | $q_2$ | $q_1$ | $q_0$ | 1 | 0 | 0 | 0 | 0 |
| | 1 | 1 | 1 | $q_3$ | $q_2$ | $q_1$ | $q_0$ | | 0 | 1 | $q_3$ | $q_2$ | $q_1$ | $q_0$ | 1 | 0 | 0 | 0 | 0 | 0 |

INTEGRATED PCM LEVEL CONTROL AND CONVERSION USING A LOOKUP TABLE

This is a continuation of application Ser. No. 07/589,677, filed Sep. 28, 1990, now abandoned.

FIELD OF THE INVENTION

The present invention pertains to the field of digital telecommunication networking systems for voice, data, image, and video transmission. More particularly, this invention relates to an apparatus and method for "companding" (compression and expanding) voice signals from one digital format to another and modifying the power level of the compressed signal using a lookup table rather than computing such compression, expansion and level change in real-time using a mathematical algorithm.

BACKGROUND OF THE INVENTION

One technique used in high-speed digital communications systems is known as packet switching and may be used for transmitting all types of data, including voice, for a wide variety of applications. Packet switching digital networks allow data to be transmitted to other channels in the networking system in a packetized form. These packets contain such information as destination network and channel, origin network node and channel, parity information, as well as the data being transmitted. Because voice is an analog signal, it must be digitized prior to being transmitted on the networking system. Such digitization is known as compression. Converting the digitized signal back to an analog form is known as expansion. Performing both of these functions is known as "companding."

An international standard for converting voice to a digital form for transmission in a network is know as Pulse Code Modulation (PCM). Samples of the voice are taken at 8000 times per second, and the height of the pulses are converted to digital values. PCM needs only 8 bits to measure pulse height over the full volume range of a voice. The specific form of non-linear encoding for PCM is the "$\mu$-law" algorithm in North America and Japan, and "A-Law" in the rest of the world, particularly Europe. In North America and Japan type T1 standard channel banks are used in the networking systems which are capable of handling up to 24 incoming channels at a maximum rate of 1.544 megabits per second (Mbps). In most of the rest of the world, type E1 (CEPT) standard channel banks are used which are capable of handling up to 30 channels at a maximum rate of 2.048 Mbps (with two additional supervisory channels used for control of the networking system).

In order to provide the most flexibility in a digital packet-switching system, allowing communication between North America, Japan and the rest of the world, these networking systems must provide a means for translating the "$\mu$-law" encoded signal to an "A-law" encoded signal, and an "A-law" encoded signal to a "$\mu$-law" encoded signal. Various techniques provide a means for accomplishing this, specifically the techniques described in the article, "Companding Routines for the TMS31130/TMS32020" by Lou Pagnucco and Cole Erskine, which appeared in Chapter 5 of *Digital Signal Processing Applications with the TMS320 Family: Theory, Algorithms and Implementations* at pages 169 through 197 (Texas Instruments 1986). These techniques require the use of a digital signal processor and its corresponding hardware. The use of a digital signal processor, however, is an expensive and complicated solution.

Alternatively, a lookup table may be used to convert from A-Law to $\mu$-law and vice-versa. Because eight bits are sufficient to encode a human voice in PCM form, such a table would only require 256 entries for each conversion required. This requires at least 256 entries of eight bits each, along with the corresponding hardware, in order to implement the lookup table approach. Unlike the approach taken with the digital signal processors, at least 256 entries of eight bits each per conversion is required. This approach does have the advantage, however, that digital signal processors need not be used. Since memory is generally cheaper than digital signal processors, the lookup table approach is generally cheaper.

Another problem sometimes encountered with networking systems is that transmission levels may vary on certain channels in a system because of varying equipment quality, or due to other equipment coupled in the system such as channel banks and echo cancellers. Certain transmission channels may also be particularly strong or weak and may vary if certain lines are used primarily for long-distance. Also, according to a user's particular aesthetic requirements, the levels on particular channels in the system may need to be increased or decreased accordingly. Lastly, some equipment emits PCM with gain already applied, i.e. the transmission level point (TLP) of the equipment is already higher than the nominal TLP in the system. Therefore, it is desirable to apply a loss to the signal level to obtain optimum network performance. For the purposes of the remainder of this application, "gain loss" refers to adjusting the level of a transmission, whether it is a gain or a loss.

In view of these problems, most networking systems provide a means for varying the power level of particular channels in the system to maintain an optimum transmission level point (TLP). This has been done in prior art systems by using a separate power level circuit usually situated in a place before PCM expansion takes place. This adds greater complexity and cost, along with the attending pitfalls of such complexity (e.g. greater maintenance).

SUMMARY AND OBJECTS OF THE INVENTION

In view of the limitations of known systems and methods an object of the present invention is to provide a technique that performs translation between encoding standards along with modifying the level of a signal in a digital networking system without the need for real-time digital signal processing.

This and other objects of the invention are provided for by a method and apparatus for converting a signal by reading a first signal that is represented in a first format. The first signal is used as an index into a lookup table, the first table containing entries representing signals in a second format modified by a gain/loss value. The first table outputs a second signal responsive to the index provided by the first signal, wherein the second signal is represented in a second format.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
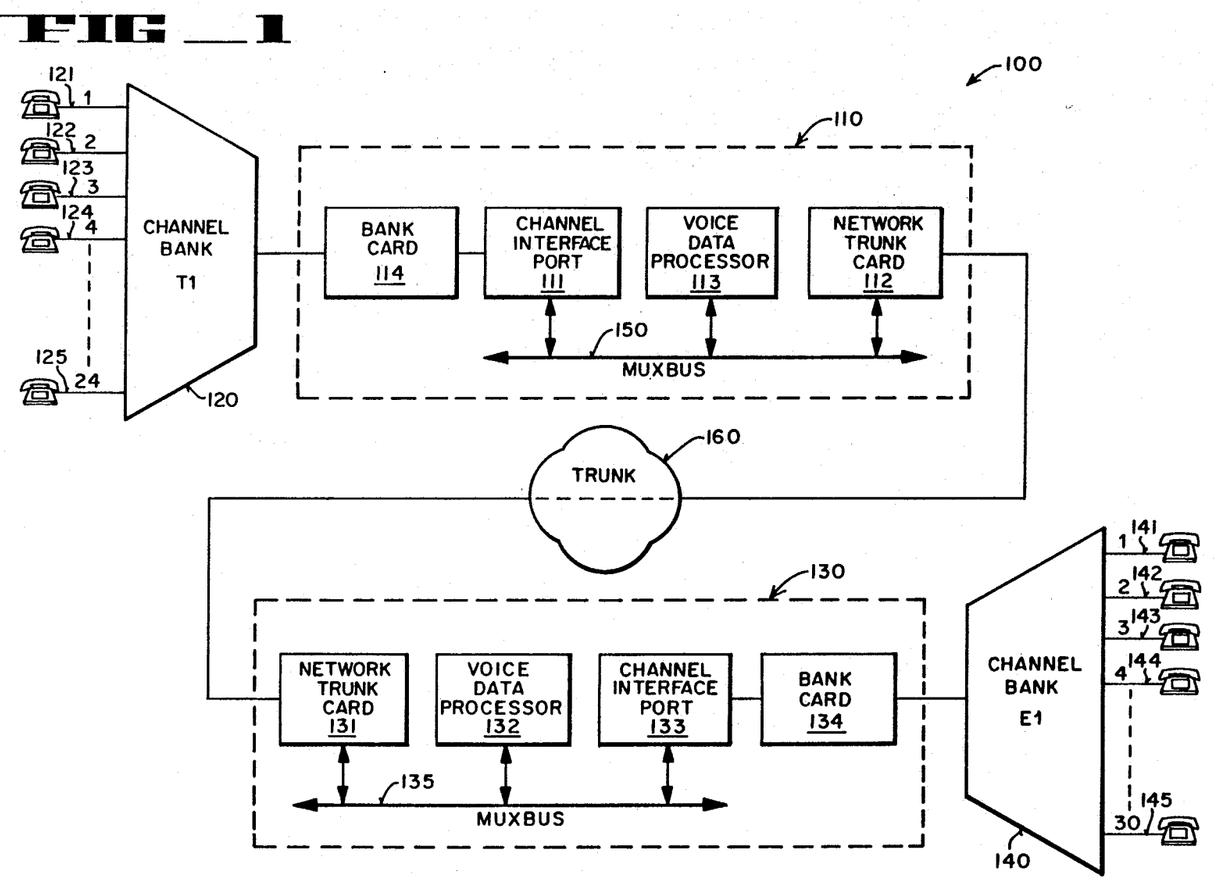
FIG. 1 is a block diagram of a network which is used in the preferred embodiment.

FIG. 1 illustrates a portion of an digital network system 100 upon which a preferred embodiment of the present invention is implemented. Because only a portion of the system will perform the conversion and level adjustment functions, only relevant portions of the network is shown in FIG. 1. Shown in FIG. 1 are two network nodes 110 and 130, coupled to their corresponding channel banks 120 and 140. One channel bank, such as 120, may be a T1 (North American standard channel bank) using $\mu$-Law companding, whereas a second channel bank, such as 140, may be a E1 (CEPT) channel bank using A-Law companding. The two network nodes 110 and 130 are coupled via a series of digital lines and switching units, shown generally in FIG. 1 as trunk circuit 160. Trunk circuit 160 is used for ensuring that each node and its appropriate channel, such as 110 and 130, receive the appropriate packets. In other words, if more than two nodes were connected to digital networking system 100, trunk circuit 160 would ensure that the appropriate network node received the appropriate packets. Because trunk 160 is outside the scope of this application, it will not be discussed in detail. For the purposes of explanation, it will be assumed that only two network nodes exist on network 100, and each is transmitting packets to the other. For the purpose of explaining the circuitry and method used in the preferred embodiment, and because each network node, such as 110 and 130, are similarly constructed, only one network node 110 will be discussed.

Network node 110 generally comprises three sections of circuitry for processing incoming and outgoing signals which is pertinent to the present invention: Channel Interface Port (CIP) 111, Voice Data Processor (VDP) 113 and Network Trunk Card (NTC) 112. NTC 112 interfaces with trunk 160 in order to handle routing and message passing of information and is controlled over a bus known as the MUXBUS 150. NTC 112 provides the capability to connect to trunk circuit 160 for a variety of standards, including, T1 and E1.

Figure 2:
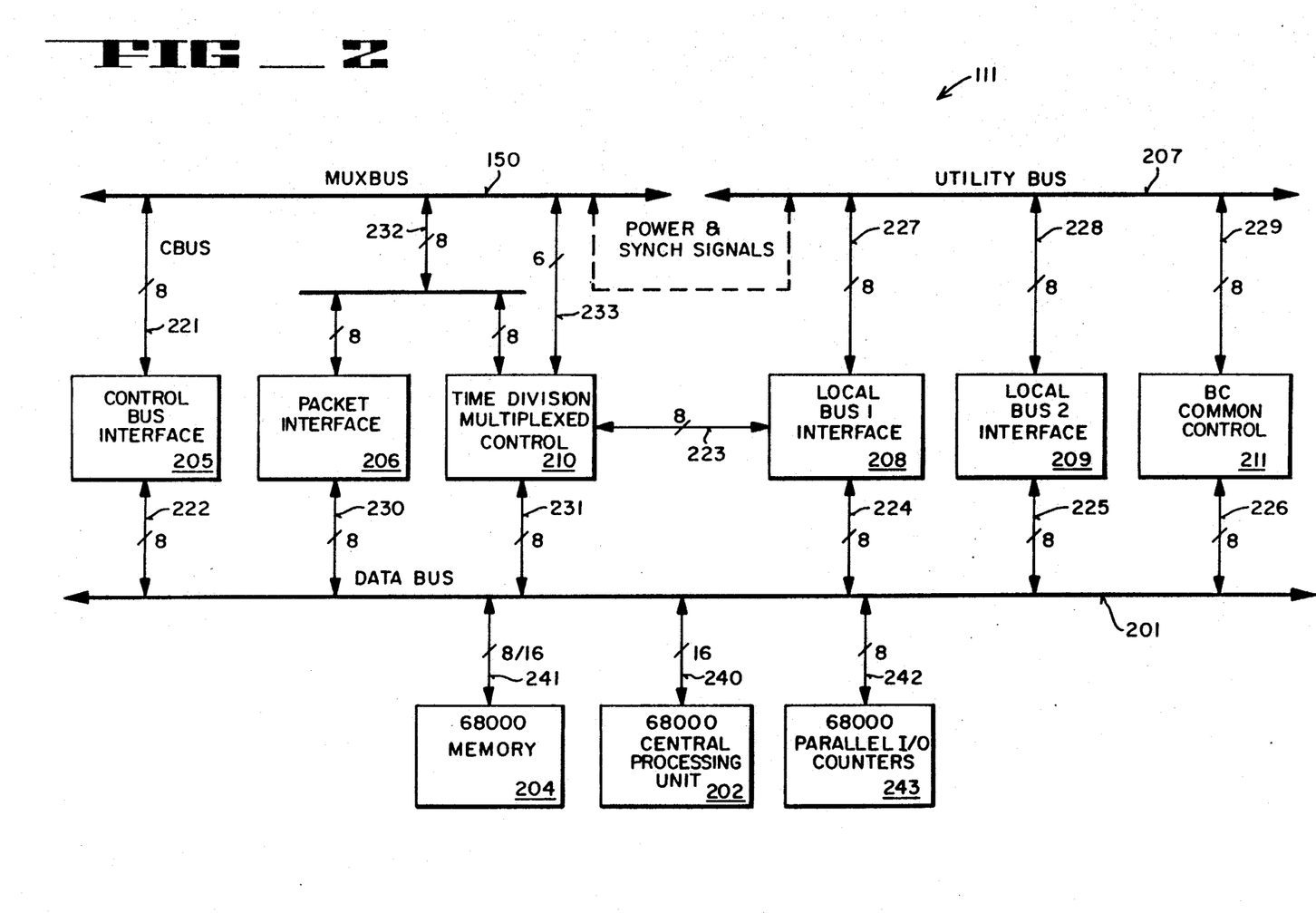
FIG. 2 shows a detailed view of a Channel Interface Port which is used in the preferred embodiment.

As voice signals are received from a channel bank, such as the T1 bank shown as 120 in FIGS. 1 and 2, analog to digital converters residing in 120 digitize incoming voice signals and transmit the PCM data to back card (BC) 114 and then to CIP 111. Data received by CIP 111 is then translated to the appropriate PCM format (either $\mu$-law or A-law, depending on the destination channel) and transmitted to VDP card 113. Then, VDP card 113 packetizes the signal and transmits the signal to NTC card 112, which then transmits the packet to trunk 160. For a signal input to channel bank 120 in FIG. 1, the signal is $\mu$-Law PCM encoded because port 120 is a T1 port. The signal is therefore converted to A-Law encoding because destination channel bank 140 is of type E1.

Voice information received from E1 channel bank 140 to network node 110 is processed in reverse order. An incoming packet will be received by NTC 112, and transmitted to VDP 113 for de-packetization. Once the digital voice information is de-packetized, it will be transmitted to CIP 111, which could convert the information from the existing A-law PCM encoding (because channel bank 140 is an E1 type, and if no previous translation was done), to $\mu$-law PCM encoding. The translated signal can then be transmitted to the T1 port 120 via BC 114, and digital-to-analog expansion takes place converting the digital voice information to an analog signal for receipt by a listener on one of the phone lines 121–125, shown in FIG. 1.

As shown in FIG. 1, MUXBUS 150 provides control and allows communication of information within network node 110, as well as receiving information from trunk 160. As mentioned previously, incoming data from channel bank 120 is sampled at a rate of 8000 frames per second for at most 24 channels in the T1 standard (30 channels in the E1 standard), each channel transmitting eight bits. This provides 192 bits per frame for T1 standard equipment using $\mu$-Law (240 bits for E1 equipment using A-law). Also, if a particular node has more than one CIP, MUXBUS 150 may also allow communication and translation between CIP's. The architecture of CIP 111 used in the preferred embodiment will now be discussed with reference to FIG. 2.

As shown on FIG. 2, CIP 111 comprises a data bus or other communication means 201 for communicating information with the remainder of network node 110 and the trunk circuit 160 shown in FIG. 1, a utility bus 207 for communicating with channel bank 120 via BC 130 shown in FIG. 1, a processing means 202 coupled to data bus 201 for processing information, a random access memory (RAM) or other dynamic storage device 204 (commonly referred to as main memory) coupled to bus 201 via lines 240 for storing information and instructions for processor 202. CIP 111 also comprises a read only memory (ROM) or other static storage device (Not shown) which is coupled to MUXBUS 150 for storing static information and instructions for the processor 202. This ROM is a "Flash" EPROM (EEPROM), and includes the lookup table information used for initialization in the preferred embodiment. CIP 111 further comprises a control bus interface 205 for receiving control information over MUXBUS 150. Control bus interface 205 is coupled to MUXBUS 150 over CBUS 221 for receiving control information, such as timing channel and direction information, for sampling data received by CIP 111. This information is passed to CPU 202 and the remainder of CIP 111 via data bus 201 over lines 222. CIP 111 also comprises a series of counters and a parallel input/output interface 243 coupled to MUXBUS 150 via lines 242 for providing communication via external switches and/or status indicators on network node 110.

Data bus 201 is also coupled to local bus interfaces 208 and 209 for coupling utility bus 207 to data bus 201. Local bus interfaces 208 and 209 are coupled to utility bus 207 via lines 227 and 228, respectively, and to data bus 201 via lines 224 and 225, respectively. Utility bus 207 allows receipt of information from channel bank 120 by TDM (Time Division Multiplexed) Channel Interface 210 via local bus 207 to allow conversion between PCM standards and level control. TDM Interface 210 is further coupled to MUXBUS 150 and data bus 201 via lines 232 and 231, respectively, and provides a portion of the mechanism for allowing encoding conversion and level control. Packet interface 206 is also coupled to MUXBUS 150 via lines 232, and to data bus 201 via lines 230, and allows the components within CIP 111 to read packets obtained from MUXBUS 150 and trunk circuitry 160. CIP 111 lastly comprises a BC (Back Card) Common Control 211 which is coupled to utility bus 207 via lines 229, and to data bus 201 via lines 226. This circuitry provides monitoring and control of the port interface for channel bank 120.

Processor 202 of the preferred embodiment is an MC68000 microprocessor manufactured by Motorola, Inc. of Schaumburg, Ill. In a preferred embodiment, CIP 111 uses an embedded real-time operating system. An application running under this operating system performs the initialization of the lookup table within TDM Control circuit 210.

Figure 3:
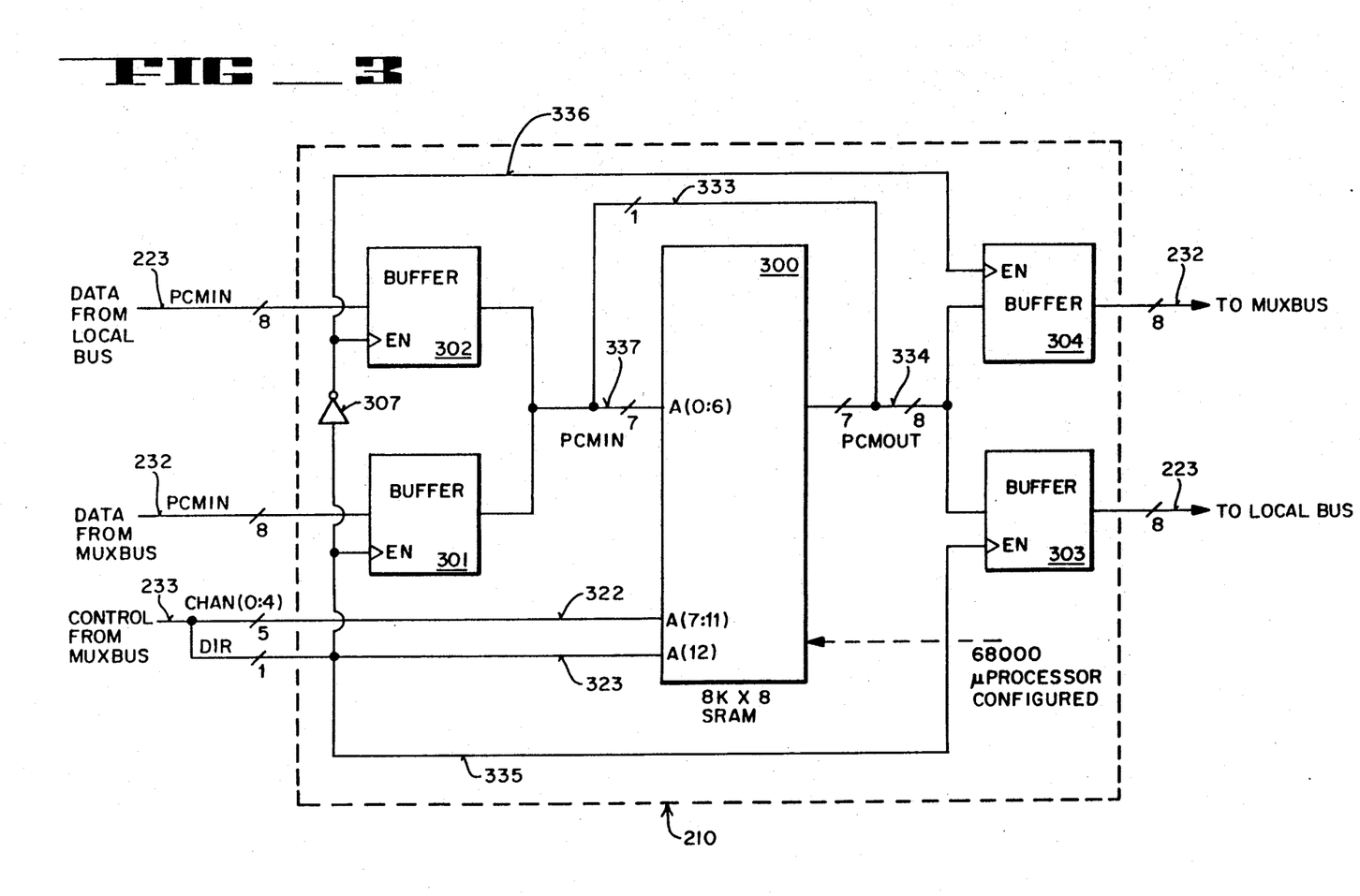
FIG. 3 shows the memory which has a lookup table along with the corresponding circuitry of the preferred embodiment.

A detailed representation of TDM Control circuit 210 is shown in FIG. 3. TDM Control 210 accepts data input from both MUXBUS 150 via lines 232, and Local bus 207 (channel bank 120) via lines 223. Control information is also obtained from MUXBUS 150 via lines 233. A portion of TDM control 210 is a "Configuration RAM" (CRAM) 300 that is an eight kilobit × 8 bit static random access memory (SRAM) which accepts as input address information both the control information obtained from lines 233 and the PCM input data obtained from lines 223 (local bus) or 232 (MUXBUS). At run-time, CRAM 300 has already been configured by CPU 202 shown in FIG. 2 via line 231 when power in network node 110 has been activated. The configuring of CRAM 300 is discussed with reference to FIGS. 4 and 5.

The seven least significant bits of the address input to CRAM 300 over lines 337 contain the PCM input data either obtained from local bus 207 or MUXBUS 150. The sign bit of the PCM data is passed through unchanged over line 333 forming the most significant bit of the PCM output data from CRAM 300 onto lines 334. The next five bits in the address contain the channel information and is coupled to CRAM 300 via lines 322. Finally, the last bit in the address contains direction information which is transmitted over line 323. Line 323 transmits a one when the information is being transmitted to local bus 207, and transmits a zero when information is being transmitted to MUXBUS 150.

PCM input information from both local bus 207 over lines 223 and MUXBUS 150 over lines 232 is buffered by two buffers 302 and 301, respectively. This allows CRAM 300 to keep pace with the sampling and transmission of data received from either the channel bank 120 or from trunk circuit 160. The buffers are enabled by line 323 which selects which of the buffers is to accept data. Buffer 301, accepting information from the MUXBUS will accept data when line 323 transmits a one, thus enabling buffer 301. Output buffer 303 is also enabled by line 335 which is also coupled to line 323.

Buffer 302 will accept PCM input data when line 323 transmits zero. Buffer 302 is enabled because inverter 307 is in line 323 just before buffer 302. Further, output buffer 304 is also enabled because it is coupled after inverter 307 via line 336 when line 323 transmits a zero. Depending on which buffer is enabled, lines 337 comprising the least significant bits of the address into CRAM 300 will contain the appropriate PCM input data (without the sign bit). Output from CRAM 300 is generated over lines 334, for receipt by buffers 303 and 304 for output to either MUXBUS 150 over lines 232 or local bus 207 over lines 223. The channel and direction information provided on lines 322 and 323 (the most significant bits of the address into CRAM 300) by MUXBUS 150 allows different zones of CRAM 300 to be addressed to affect each channel independently.

As mentioned previously, the control and data lines into CRAM 300 address given entries in CRAM 300. Therefore, for each possible PCM input value (without the sign bit), channel number, and whether the PCM input value is going to MUXBUS 150 or to local bus 207, the PCM output value contained on lines 334 is distinct. Therefore, translation between two PCM encoding standards (such as A-Law to $\mu$-law, or vice-versa) may be accomplished, as well as adjusting the level of the translated PCM signal. Also, as mentioned above, when network node 110 is initially powered up, CRAM 300 is automatically initialized from an EEPROM addressable over MUXBUS 150 during a start-up-routine performed by CPU 202. That routine is discussed with reference to FIG. 4.

Figure 4:
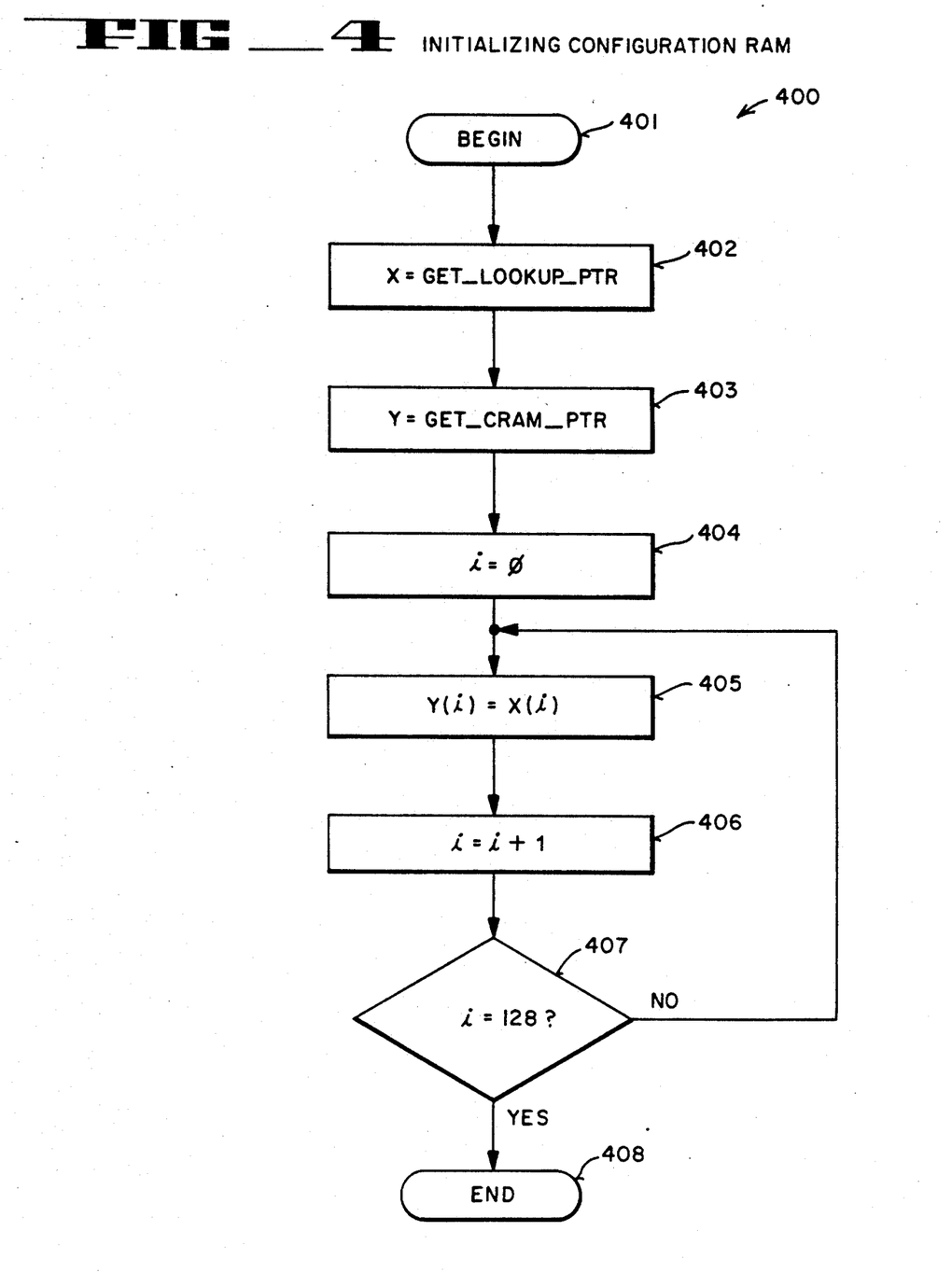
FIG. 4 shows a method of initializing a memory containing a lookup table from non-volatile storage.

FIG. 4 shows the initialization procedure used by CPU 202 to copy the values impregnating a configuration EEPROM to initialize CRAM 300 for a given channel and conversion. For instance, different values will be required whether the given signal is going from trunk 160 to channel bank 120, or from channel bank 120 to trunk 160. The values which impregnate the EEPROM will be determined in the factory or by an field engineer. Values will be generated depending on the type of channels communicating in network 100. Process 400 starts at step 401 and determines for the given channel the start of the 128 value range for the PCM values in the EEPROM and sets an initialization pointer X equal to the start of that range. Since each channel may have its own gain or loss value (again, preset by the factory or a field engineer), and its own conversion algorithm, blocks of 128 are initialized at one time by process 400.

Once the start of the range has been determined, at step 403 a second pointer, Y, is set to the start of the range for the channel in CRAM 300 is determined, and index i is initialized to the first (0) value at step 404. Then, the value in CRAM pointed to by Y is set equal to the corresponding value in initialization EEPROM, at step 405, and i is incremented at step 406. 407 determines whether initialization for the channel is complete, and if not, process 400 branches to repeat steps 405 through 407, once again. Upon completion of an entire 128-value range for a particular channel, process 400 completes at step 408. The lookup values for the channel have then been copied from the configuration EEPROM to CRAM 300.

Figure 5:
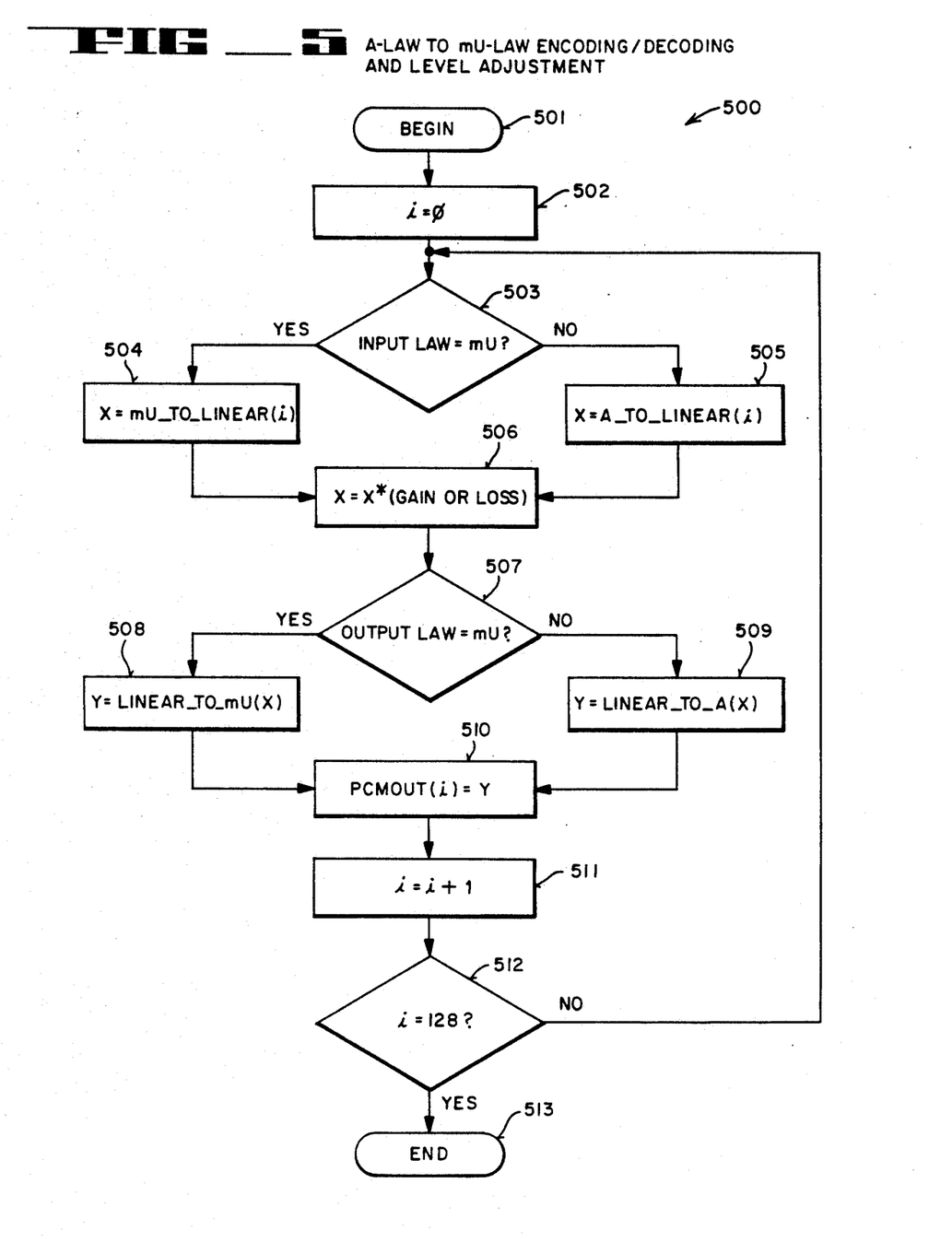
FIG. 5 shows a method of initializing a memory containing a lookup table for storing in non-volatile storage.

FIG. 5 shows a process for generating the lookup table for a particular channel which may be stored in the configuration EEPROM. The Gain or Loss value must be preset prior to entering process 500, for the particular channel for which the lookup table is required. Process 500 starts at step 501, and initializes index i at step 502. Step 503 determines whether the PCM input value has been compressed using a $\mu$-Law algorithm (for T1 equipment). If so, then a variable x is set equal to the linear value of the $\mu$ compressed value at step 504. If the PCM input value does not use $\mu$-law compression, then an A-Law to linear value for the particular level is chosen at step 505. Process 500 continues at step 506 wherein x is set equal to the linear value contained in x (computed above) multiplied by the preset gain/loss value. This gain/loss value, as discussed, may vary according to the user's preference according to the equipment being used, line quality, user application or aesthetics. Step 507 then determines whether the output value is to be compressed using the $\mu$-law compression algorithm. If so, then step 508 is performed, generating the $\mu$-law compressed value for the given value of x, and storing the result in variable y. If not, step 509 is performed, computing y, which is the A-law compressed value of x.

Process 500 continues at step 510 and sets the ith PCMOUT value for to y (which is the translated and gain/loss modified value) i is then incremented at step 511, and is checked at 512 to see whether the entire possible range for the channel has been computed. If not (i is less than 128) then process 500 performs steps 503 through 512 repeatedly until i is equal to 128. Once completed, process 500 ends at step 513, and the configuration EEPROM contains a full range of 128 possible compressed PCM output values for the portion of the CRAM containing the lookup table for this channel. At powerup, CPU 202 may then copy these values into CRAM 300 for use when network node 110 is operational.

Certain formulas govern the PCM expansion and compression used to seed the configuration EEPROM in steps 504, 505, 508, and 509. For $\mu$-law compression (step 508) used in North America and Japan, the compression is governed by the following formula:

$$F(x) = \text{sgn}(x) \frac{\ln(1 + \mu|x|)}{\ln(1 + \mu)}$$

where F(x) is the compressed output value, x is the normalized input signal (between $-1$ and 1), $\mu$ is the compression parameter ($=255$ in North America), and sgn(x) is the sign ($\pm$) of x. A-law compression (step 509) used in most of the rest of the world, is governed by the following formulas:

$$F(x) = \text{sgn}(x) \frac{A(x)}{1 + \ln(A)}$$

where A is the compression parameter (87.6 in Europe and most of the rest of the world) and $0 \leq |x| < 1/A$ and $$F(x) = \text{sgn}(x) \frac{(1 + \ln(A|x|))}{1 + \ln(A)}$$

when $1/A \leq |x| \leq 1$.

Figure 6A:
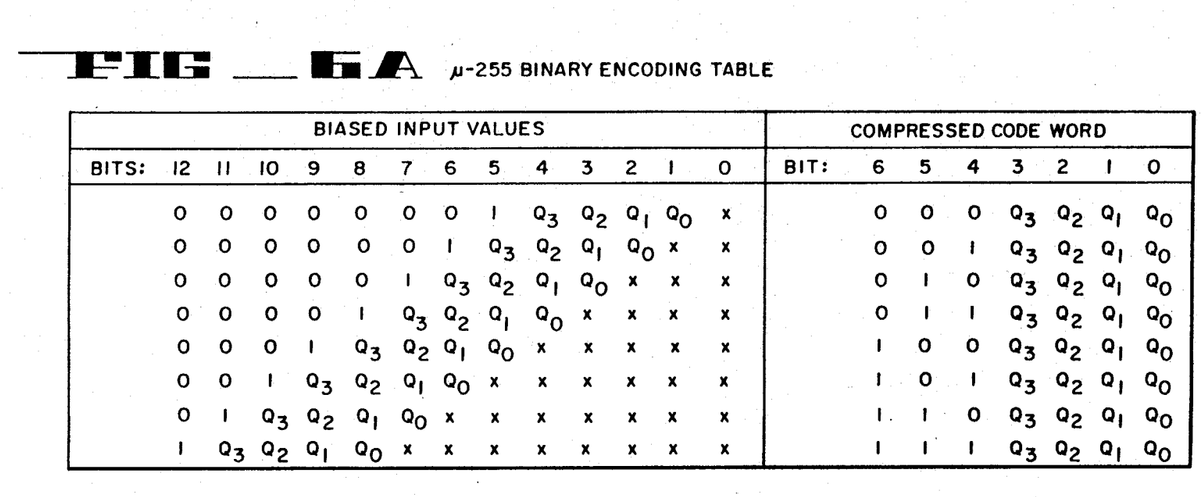
FIGS. 6A and 6B show tables for PCM companding using the $\mu$-law algorithm.
Figure 6B:
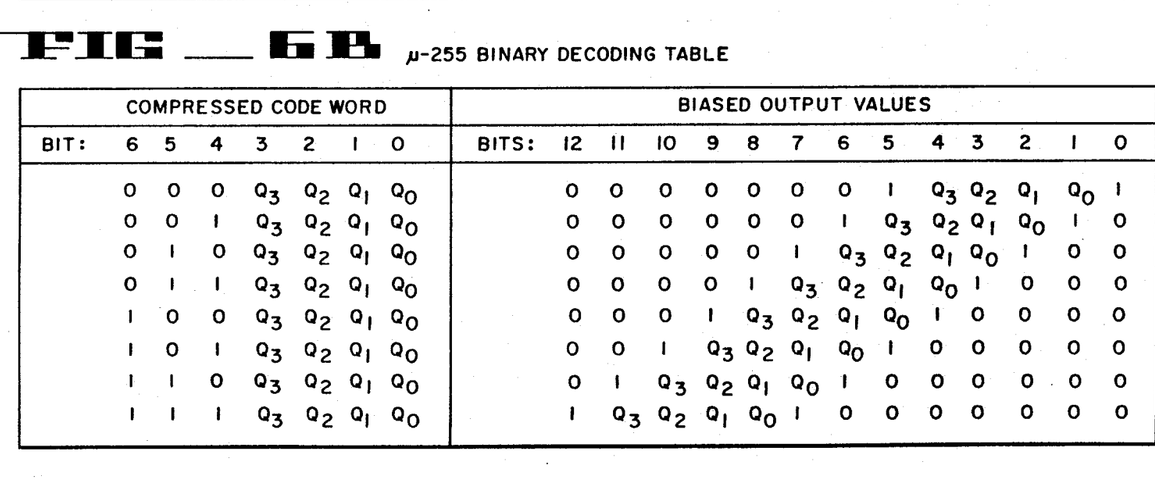
Figure 7A:
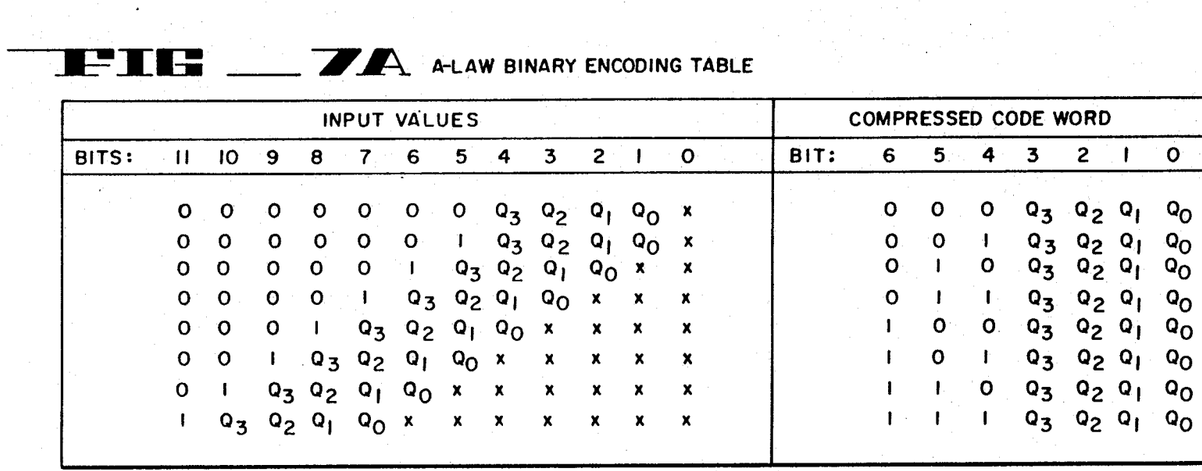
FIGS. 7A and 7B show tables for PCM companding using the A-law algorithm.
Figure 7B:
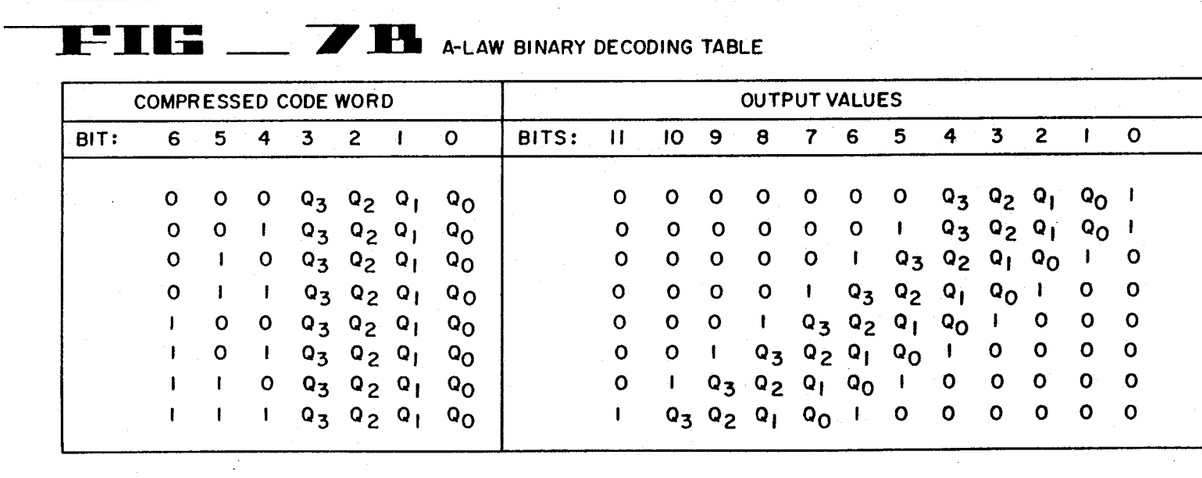

In the preferred embodiment, however, instead of computing these values, lookup tables are used for PCM encoding/decoding when performed at the factory for the customer. For $\mu$-law encoding, given an input analog signal, the table set forth in FIG. 6a is used. However, prior to $\mu$-law encoding, a positive input analog value is biased by adding 33 to the value, and the binary equivalent of the biased value is used to look up the encoded value in FIG. 6a. Note that the polarity bit is not shown in any of these figures because it is passed through transparently, and is not needed to form the lookup table. For a negative value, the bias is subtracted from the number prior to binary conversion and encoding. For $\mu$-law decoding, the table set forth in FIG. 6b is used, and the converse is true. Once a lookup of the binary encoded value is performed, the bias is subtracted from a positive decoded value. For a negative decoded value, the bias is added to the number which is obtained from the look up. For A-law encoding, FIG. 7a's table is used, and for A-law decoding, FIG. 7b's table is used. No biasing of either the encoded or decoded values is required.

Note also that the gain/loss modification set forth at step 506 in FIG. 5 is numerically computed after the lookup operations set forth above, since the value is custom-generated for each channel in the user's equipment by the field engineer. The configuration EEPROM contains 15 different selectable gains/losses for four different translations ($\mu$-law to A-law, A-law to $\mu$-law, $\mu$-law $\mu$-law, and A-law to A-law), as well as a transparent mode (no translation or level control). Therefore, 61 different lookup tables of 128 entries each reside in the configuration EEPROM from which a field engineer may configure each channel in the network. The EEPROM may also be customconfigured.

The preferred embodiment of the foregoing has the advantage that translation between $\mu$-law PCM encoding and A-law PCM encoding may be accomplished without resorting to the expensive solution requiring digital signal processors operating in real-time. Also, since an SRAM lookup table has a relatively fast access time, lookups may be done in the lookup table without a performance penalty, and such a configuration is relatively cheaper than this other solution. The preferred embodiment is also preferable over the other solutions in that it provides flexibility (it is modifiable and different channels may map to different translations and gain/loss settings) while providing the maximum range of PCM compressed values which are expected to occur in a networking node, such as 110.

In the foregoing specification the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrated rather than a restrictive sense.

What is claimed is:

1. An apparatus in a network node of a telecommunication system for (1) converting a first signal from a first pulse code modulation (PCM) encoding to a second PCM encoding and (2) modifying the first signal by a first value, wherein the first signal can be an incoming signal of the network node and an outgoing signal of the network node, wherein the apparatus comprises:

(A) a configurable random access memory (CRAM) for (1) converting the first signal from the first PCM encoding to the second PCM encoding and (2) modifying the first signal by the first value, wherein the CRAM is reconfigurable and rewritable, wherein the CRAM receives the first signal in the first PCM encoding, wherein the CRAM outputs the first signal in the second PCM encoding with the first value, wherein the first and second PCM encodings each can be one of an A-Law encoding and a μ-Law encoding, wherein the CRAM includes a lookup table among the A-Law and μ-Law encodings and the first value in order for the CRAM to convert the first signal from the first PCM encoding to the second PCM encoding and to modify the first signal by the first value, wherein the first signal includes a direction value and a channel identifier, wherein the channel identifier of the first signal identifies (1) whether the first PCM encoding of the first signal is the A-Law encoding or the μ-Law encoding, (2) whether the second PCM encoding of the first signal is the A-Law encoding or the μ-Law encoding, and (3) the first value that the first signal is to be modified, wherein the direction value of the first signal can be in a first state and a second state, wherein when the first signal is the incoming signal, the direction value of the first signal is in the first state, wherein when the first signal is the outgoing signal, the direction value of the first signal is in the second state, wherein the first signal in the first PCM encoding is applied to the CRAM with the channel identifier and the direction value of the first signal as an address to access the lookup table of the CRAM for the first signal in the second PCM encoding with the first value;

(B) first buffering means coupled to the CRAM for buffering the first signal in the first PCM encoding before the first signal is applied to the CRAM for conversion, wherein the first buffering means receives the first signal in the first PCM encoding when the first signal is the incoming signal of the network node, wherein the first buffering means does not receive the direction value and the channel identifier of the first signal when the first buffering means receives the first signal, wherein the first buffering means does not receive the first signal when the first signal is the outgoing signal;

(C) second buffering means coupled to the CRAM for buffering the first signal in the first PCM encoding before the first signal is applied to the CRAM for conversion, wherein the second buffering means receives the first signal in the first PCM encoding when the first signal is the outgoing signal of the network node, wherein the second buffering means does not receive the direction value and the channel identifier of the first signal when the second buffering means receives the first signal, wherein the second buffering means does not receive the first signal when the first signal is the incoming signal, wherein the directional value and the channel identifier of the first signal are directly applied to the CRAM without being stored in a memory before applied to the CRAM;

(D) third buffering means coupled to the CRAM for receiving the first signal in the second PCM encoding with the first value from the CRAM, wherein the third buffering means receives the first signal in the second PCM encoding with the first value from the CRAM and supplies as an output of the apparatus the first signal in the second PCM encoding with the first value when the first signal is the incoming signal of the network node, wherein the third buffering means does not receive the first signal from the CRAM when the first signal is the outgoing signal of the network node;

(E) fourth buffering means coupled to the CRAM for receiving the first signal in the second PCM encoding with the first value from the CRAM, wherein the third buffering means receives the first signal in the second PCM encoding with the first value from the CRAM and supplies as the output of the apparatus the first signal in the second PCM encoding with the first value when the first signal is the outgoing signal of the network node, wherein the third buffering means does not receive the first signal from the CRAM when the first signal is the incoming signal of the network node;

(F) enabling means coupled to the first, second, third, and fourth buffering means for controlling the first, second, third, and fourth buffering means to selectively receive the first signal under control of the direction value of the first signal, wherein the enabling means receives the direction value of the first signal, wherein the enabling means enables the first and third buffering means to receive the first signal when the direction value of the first signal is in the first state, wherein the enabling means enables the second and fourth buffering means to receive the first signal when the direction value of the first signal is in the second state; and (G) configuring means coupled to the CRAM for configuring the CRAM such that the CRAM can be dynamically reconfigured to have a different lookup table.

2. The apparatus of claim 1, wherein the first PCM encoding is the A-Law encoding and the second PCM encoding is the μ-Law encoding.

3. The apparatus of claim 1, wherein the first PCM encoding is the μ-Law encoding and the second PCM encoding is the A-Law encoding.

4. The apparatus of claim 1, wherein the first PCM encoding is the A-Law encoding and the second PCM encoding is the A-Law encoding.

5. The apparatus of claim 1, wherein the first PCM encoding is the μ-Law encoding and the second PCM encoding is the μ-Law encoding.

6. The apparatus of claim 1, wherein the CRAM is a static random access memory.

7. The apparatus of claim 1, wherein the first value can be one of a signal gain and a signal loss.

8. The apparatus of claim 1, wherein the enabling means comprises an inverter, wherein the enabling means applies the direction value of the first signal to the first and third buffering means via the inverter, wherein the enabling means directly applies the direction value to the first and third buffering means.

9. The apparatus of claim 1, wherein the configuring means comprises a microprocessor and an electrically erasable and electrically programmable read only memory.

10. The apparatus of claim 1, wherein the first signal comprises a sign bit which bypasses the CRAM during conversion.

* * * * *